United States Patent [19]
Ahlgren et al.

[11] Patent Number: 5,766,971
[45] Date of Patent: Jun. 16, 1998

[54] OXIDE STRIP THAT IMPROVES PLANARITY

[75] Inventors: David C. Ahlgren, Wappingers Falls; Gary B. Bronner, Stormville; Wesley C. Natzle, New Paltz, all of N.Y.; Erick G. Walton, South Burlington, Vt.; Chienfan Yu, Highland Mills, N.Y.

[73] Assignee: International Business Machines Corporation, Armonk, N.Y.

[21] Appl. No.: 768,010

[22] Filed: Dec. 13, 1996

[51] Int. Cl.$^6$ .................................. H01L 21/76
[52] U.S. Cl. ............... 437/67; 437/228 IS; 437/228 H; 216/39; 216/58; 148/DIG. 50
[58] Field of Search ............ 437/67, 72, 228 IS, 437/228 H; 216/39, 58; 148/DIG. 50

[56] References Cited

U.S. PATENT DOCUMENTS

| | | |
|---|---|---|
| 3,310,495 | 3/1967 | Masuda et al. |
| 3,429,791 | 2/1969 | LaBoda et al. |
| 3,518,132 | 6/1970 | Glendinning |
| 4,874,463 | 10/1989 | Koze et al. |
| 5,189,501 | 2/1993 | Kawamura et al. ............. 437/67 |
| 5,268,069 | 12/1993 | Chapple-Sokol et al. |
| 5,282,925 | 2/1994 | Jeng et al. |
| 5,316,965 | 5/1994 | Philipossian et al. ............. 437/67 |
| 5,320,708 | 6/1994 | Kadomura et al. |

OTHER PUBLICATIONS

Burggraaf, Pieter, "CMP: Suppliers Integrating, Applications Spreading", Semiconductor International, Nov. 1995, pp. 74–82.

Singer, Peter, "New Frontiers in Plasma Etching", Semiconductor International, Jul. 1996, pp. 152–164.

Primary Examiner—Trung Dang

[57] ABSTRACT

A process for stripping thin layers of oxide such as sacrificial pad oxide employs etching chemistry that widens cracks to remove shallow cracks and limit the widening of deep cracks, thereby producing a final oxide surface on thick layers of oxide that is less rough than prior art methods and enabling the fabrication of oxide-filled trenches that have geometries and/or surface smoothness that were previously impossible.

26 Claims, 3 Drawing Sheets

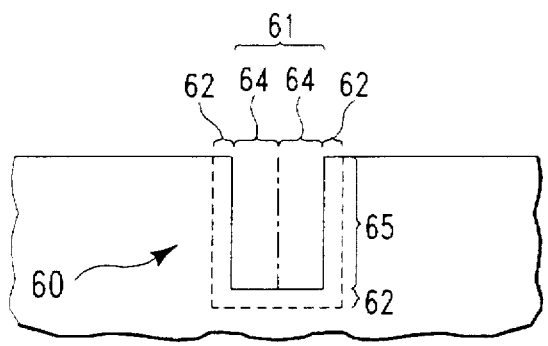
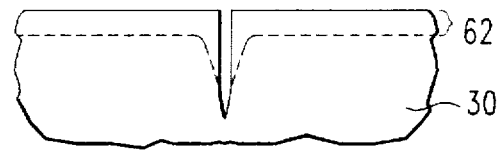
FIG. 4A  FIG. 4B
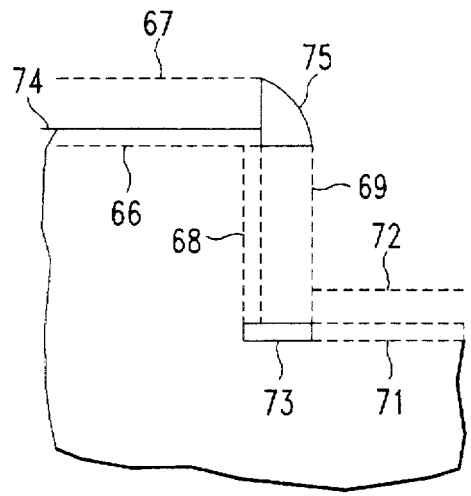
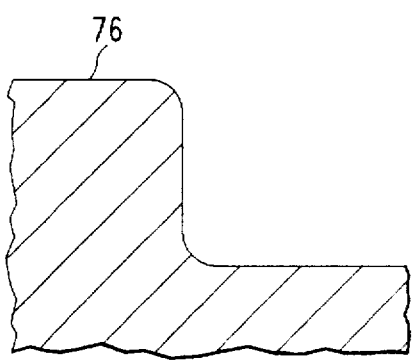
FIG. 5  FIG. 6
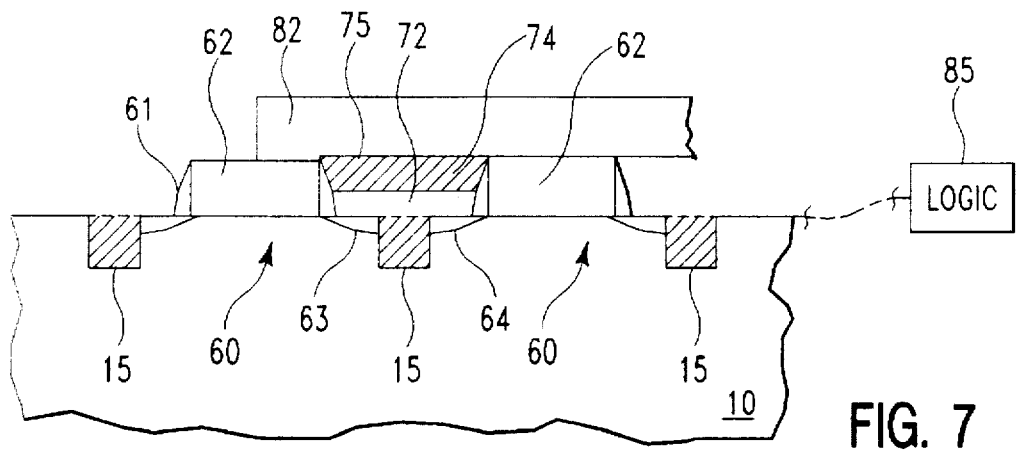
FIG. 7

OXIDE STRIP THAT IMPROVES PLANARITY

TECHNICAL FIELD

The field of the invention is silicon integrated circuit processing, in particular stripping films chemically.

BACKGROUND

U.S. Pat. No. 5,282,925 discloses a method of stripping oxide by means of reacting HF with the oxide in a vacuum ambient to form $SiF_4$ and then reacting the $SiF_4$ with $NH_3$ to form ammonium hexafluorosilicate, $(NH_4)_2SiF_6$, in which the ammonium hexafluorosilicate remains on the surface being etched, so that the reaction is self-limiting and etches thermal oxide and TEOS (tetra-ethyoxy silane) oxide at the same rate (after an initial period). This reference has not been applied to structures with cracks and/or seams.

Industry standard practice has been an aqueous solution of HF or HF and $NH_3$, which has the known drawback of greatly expanding cracks and other defects. If a thickness R of oxide is stripped, a crack that is initially only an Angstrom or so in width will have a final width of 2R, since the reaction is isotropic. Device isolation by means of oxide-filled trenches produces a trench with a center seam for otherwise desirable geometries. Such geometries cannot be used because the seam will be greatly enlarged during the oxide strip. During the etching of the polysilicon (poly) layer that forms the gates a standard overetch will not clean out a deep crack or groove, leaving poly at the bottom that can cause a short circuit. A lengthy overetch is not feasible because of the risk of damage to the gate oxide.

This limitation of the standard method has had the consequence that it is not possible to form an oxide filled trench with a smooth surface. The roughness of the surface permits material deposited in a later step to remain; i.e. poly can fill an enlarged groove and form a short circuit. Also, the presence of an enlarged groove or crack creates a step that may form an open circuit when a connector runs over the trench.

The art has long sought dielectric isolation having small dimensions and therefore has attempted to use isolation elements with vertical walls and high aspect ratios.

SUMMARY OF THE INVENTION

The invention relates to a gaseous method of stripping oxide or other films that employs a chemical reaction that increases surface roughness by increasing the width of cracks to eliminate shallow cracks, reduce the depth of deep cracks and round off sharp corners.

The invention enables the use of trench geometries that were previously unusable and improves the yield of geometries that have been used before.

BRIEF DESCRIPTION OF THE DRAWINGS

FIGS. 4A and 4B show initial and final dimensions of blocked grooves.

FIG. 5 illustrates the process of rounding corners.

FIG. 6 illustrates the results of the process in FIG. 5.

FIG. 7 illustrates, in partially pictorial, partially schematic fashion, a portion of an integrated circuit.

DESCRIPTION OF THE PREFERRED EMBODIMENTS

The geometrical advantage of shallow trenches with vertical walls for device isolation in submicron integrated circuit processing, as compared with LOCOS (local oxidation of silicon) isolation with its thickness limitations and the lateral spread caused by diffusion during oxidation are well known in the art. Once the trench has been formed and filled with oxide, the unwanted fill oxide is removed by etching and/or chemical-mechanical polishing (CMP), using the pad nitride as a stop. Before the active devices are formed, the pad nitride and (typically thermal) pad oxide must be stripped. Standard industry practice has been stripping the thermal pad oxide with an aqueous solution of HF and $NH_3$, which attacks the exposed oxide surface of the trench fill. Cracks that have been formed in the trench fill during CMP will be greatly enlarged, forming a receptacle for poly during subsequent processing. Residual poly left in such cracks can form shorts that reduce chip yield.

Figure 1A:
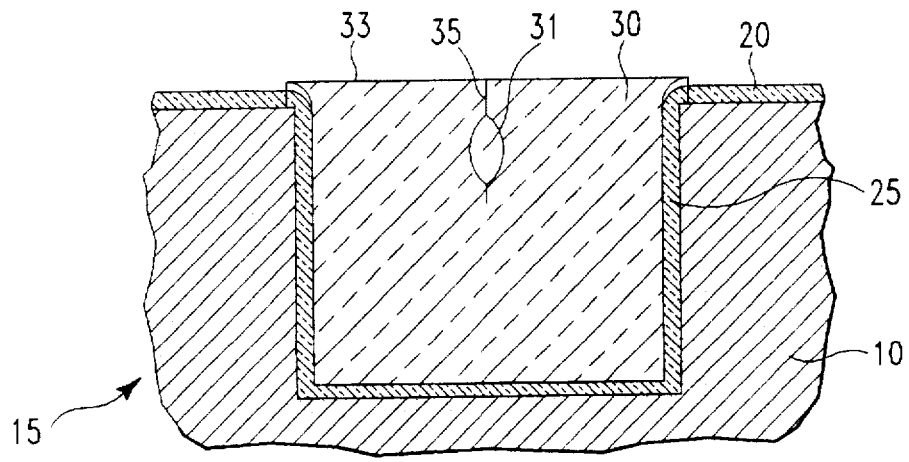
FIGS. 1A–1C show a comparison of filled trenches before stripping and after different strip processes.

Referring now to FIG. 1 there is shown in FIG. 1A a cross section of an isolation trench 15 having sidewalls at a nominal 90°, to be used for isolating active devices in a silicon integrated circuit. Trench 15 has been etched in silicon substrate 10 by a conventional dry etch process, well known to those skilled in the art, such as those described in "New Frontiers in Plasma etching", Semiconductor International, July 1996, p 152. A thin (20 nm) layer of thermal oxide 25 has been grown on the inside of trench 15 to relieve stress and passivate the exposed surface. The trench has then been filled with oxide such as TEOS oxide. TEOS and other conformal fill materials tend to form voids such as void 31 at high sidewall angles and large aspect ratios. A seam 35 is indicated at the center of the trench, caused by the meeting of material extending out from the sides. The oxide at such a seam is stressed compared to oxide elsewhere and is etched more easily in the aqueous method. Seam 35 may have openings on the order of 0.1 nm where the two sides do not meet perfectly. The term "defect" will be used to indicate generically a crack, void, interface, seam, or area of stressed oxide.

The remaining fill oxide 30 outside the trench has been removed in a conventional process, leaving top surface 33. Some methods, such as CMP ("CMP: Suppliers Integrating, Applications Spreading", Semiconductor International, November 1995, p74) tend to scratch the surface. Pad oxide 20 is next to be stripped in order to prepare the active areas for the growth of a gate oxide. The problem addressed by this invention is the preservation of smoothness of surface 33 if it is smooth or the reduction of roughness if surface 33 has cracks or scratches.

After the fill oxide is removed and the pad nitride stripped, the pad oxide is stripped according to the process described in U.S. Pat. No. 5,282,925, in which

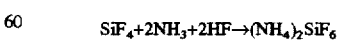

$SO_2 + 4HF \rightarrow SiF_4 + 2H_2O$ and $SiF_4 + 2NH_3 + 2HF \rightarrow (NH_4)_2SiF_6$ The reaction occurs in a single exposure of $SiO_2$ to an atmosphere of ammonia and HF. The ammonia and HF may be introduced into the reaction chamber at partial pressures of about 2–3 mTorr and 4–6 Mtorr, respectively, and at a substrate temperature of 23° C. The reaction product ammonium hexafluorosilicate ( $(NH_4)_2SiF_6$ ) sticks to the surface and forms a layer that impedes the reaction. The HF must diffuse through the ammonium hexafluorosilicate to react with the oxide, so that the reaction rate is limited by the diffusion rate of HF and the strip is self-limiting. Typically, 12 nm of oxide may be removed in a reasonable processing time of 30 min. The ammonium hexafluorosilicate reaction product is removed by either dissolving in a solution (e.g. water) or heating the wafer to a temperature greater than 100° C.

Figure 1B:
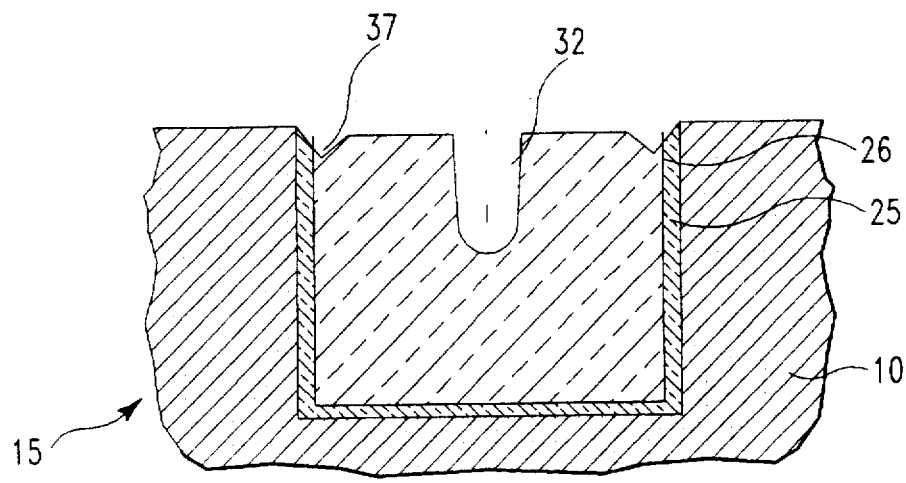

FIG. 1B shows the same cross section after a conventional strip process using aqueous HF. The thermal oxide has been stripped and the TEOS has been etched a greater amount, because TEOS etches more easily than thermal oxide. An opening 37, referred to as a divot, has been formed at crack 26 at the intersection of thermal oxide trench liner 25 and trench fill 30. The solution penetrated into small openings at the interface and etched them isotropically, resulting in a divot as wide or wider at the top as it is deep. Similarly, the solution penetrated openings along seam 35 and expanded it. When the opening reached void 31, the HF attacked the bottom and sides of the void.

Figure 1C:
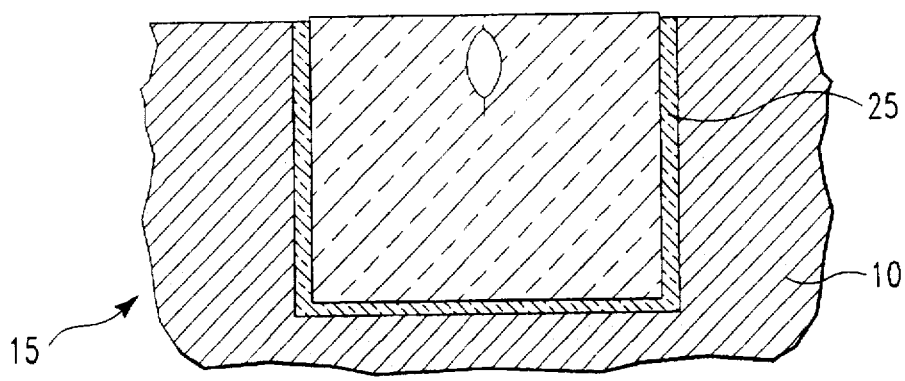

In contrast, FIG. 1C shows the same trench after a strip operation according to the invention. TEOS 30 and liner 25 have been etched to the same depth as thermal oxide 20 because the process reaches a limiting rate that is the same for TEOS, strained TEOS and thermal oxides. Seam 35 and interface 26 have not been attacked. In the example, void 31 was not exposed and the surface remains smooth.

Figure 2:
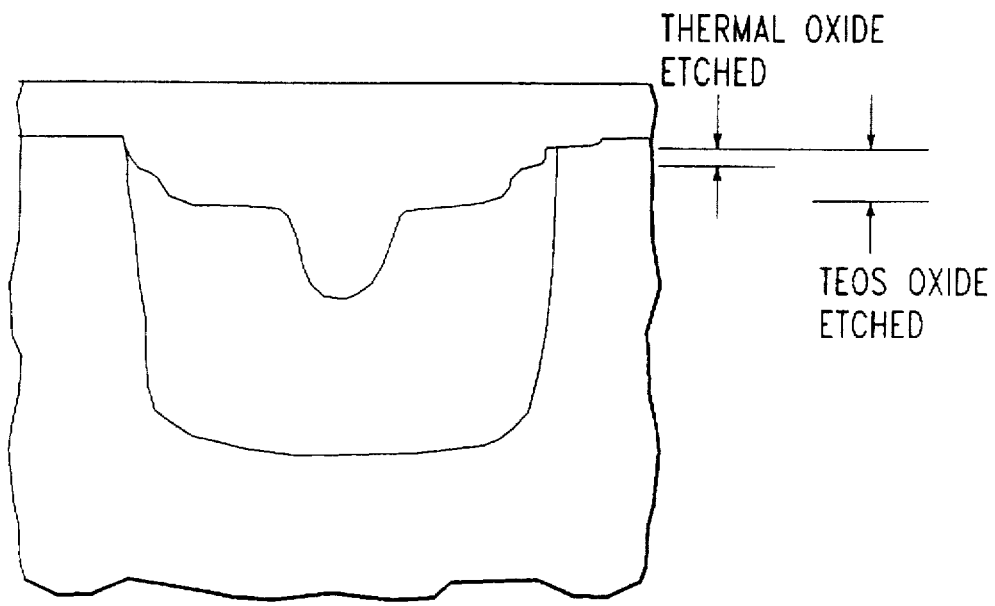
FIG. 2 shows a trace of an SEM of a prior art trench.
Figure 3:
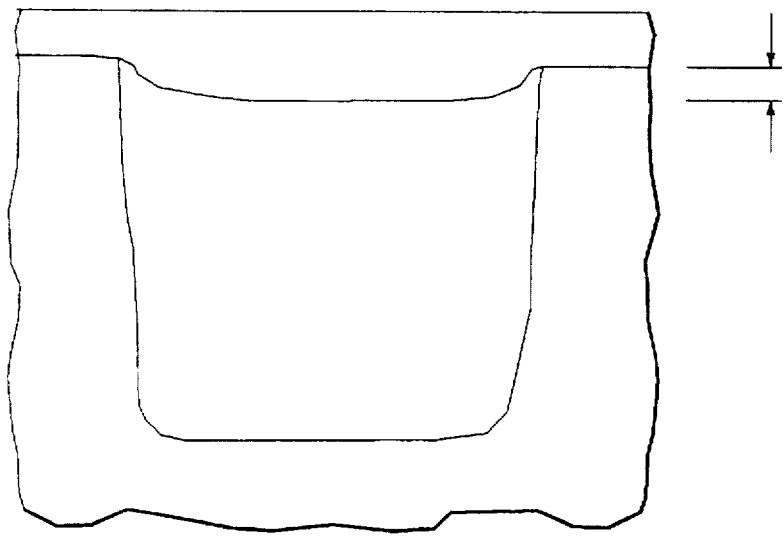
FIG. 3 shows a trench of the same dimensions after the process according to the invention.

FIG. 2 is a trace of a scanning electron microscope (SEM) micrograph of a prior art trench having dimension 0.4 μm deep and 0.5 μm wide, having an aspect ratio of 0.8 that previously was impractical for the prior art because of poor yield. The thermal oxide liner has been etched in a step on each side and the TEOS center seam has been etched to more than twice the depth of the rest of the TEOS. The seam at the center has been attacked and a groove has been formed that is much deeper than the body of the fill material. Those skilled in the art will appreciate that such a step detracts from the yield. In contrast, FIG. 3 is a corresponding SEM of a trench stripped according to the invention, showing that the liner and the fill have been etched to the same depth and the interface and seam have not been attacked.

Similarly, the HF solution attacks cracks or fractures in the oxide that are formed during the CMP step. Such fractures have a width of only a few Angstroms, but the HF solution will etch isotropically the sides and bottom. Since the bottom is etched at the same rate as the surface, the depth of the crack will not change. The width, however, will expand from an Angstrom or 2 to twice the amount of the material removed from the surface.

Prior art trenches have the drawback that the aspect ratio is typically less than 0.8 and the sides are at an angle of less than 75°, because of yield considerations. If a steeper trench were cut, the voids and seams at the center would result in a yield too low to be commercially acceptable. This limitation on sidewall angle required close control of the parameters of the etching process, giving a smaller than desirable process window. Further, for some trench etch processes, the angle of the sidewalls and the limit to a low aspect ratio force the trench to be wider than the minimum width that could be formed if there were not the problem of seam attack.

In the prior art, the steps of HF pad oxide strip, sacrificial oxide strip and nitride deglaze removed about 60 nm of TEOS oxide in a trench because of the greater etch rate in TEOS than for the thermal pad oxide and because of overetch to ensure that the pad oxide was all removed. With the inventive process, defects that are greater than 30 nm below the surface will not be exposed because the inventive process removes only about 30 nm of the trench fill while stripping the same three layers. In the prior art process, such defects would be exposed and attacked.

In the prior art, oxide filled trenches were generally annealed in order to reduce stress in the oxide fill and thus reduce the etch rate. With the present invention, less or even no annealing is required.

Referring now to FIG. 4A, there is shown a shallow groove e.g. 60 nm in length that will be slightly expanded in width but reduced in depth according to the invention. Crack or groove 60 in fill oxide 30 has an initial width $W_i$ indicated by bracket 61 and an initial depth $D_i$ indicated by bracket 65. As the oxide is etched, oxide on the sides and bottom of the trench will be removed to a depth indicated by bracket 62. It has been found that the layer of reaction product ammonium hexafluorosilicate formed during a strip process according to the invention has three times the thickness (3×) of the oxide removed. Thus, brackets 64 indicating the thickness of reaction product required to block groove 60 will each be twice as long as bracket 62 and the magnitude of length 62 will be $W_i/4$. It can then readily be seen that the final width $W_f$ of groove 60 will be close to $W_i+0.5 W_i$, or 1.5 $W_i$. The actual width will be slightly larger than this value because the ammonium hexafluorosilicate is not impermeable and the HF will continue to react with oxide after the groove is blocked, but at a much slower rate at the bottom of the groove than at the top. Similarly, the depth of the crack will not remain constant, as in the prior art, but will be reduced.

After the groove is blocked, the etching rate at the bottom will be limited by the diffusion of HF through the plug of ammonium hexafluorosilicate at the top of the groove. The final depth $D_f$ will be somewhat less than: $D_f=D_i+W_i/4-R$, where R is the thickness of oxide removed from the surface. When R is greater than or equal to $W_i/4$ the full length of the groove is blocked and further etching reduces the depth of the groove. The base of the groove is blocked prior to $R=W_i/4$ because reaction product expanding from the sidewalls near the base overlap in space, filling the base before the top. If $R>D_i+W_i/4$, then the groove will be erased.

Referring now to FIG. 4B, there is shown a characteristic shape that results from applying the process to a crack, seam or narrow groove having an initial width of about 0.1 nm. As the HF etches down on the surface and in the crack, the inventive process leaves a characteristic shape in which the bottom of the defect is closed very quickly and has a sharp point at the bottom (a few tenths of a nanometer), while the corners at the top of the defect are rounded as described below (with a radius of curvature on the order of 10 nm), so that the top of the defect is considerably wider than the bottom. If the crack is not vertical, or if it is deeper than the gate RIE overetch, then the sloping sidewalls have the further advantage that the crack is more easily cleared of polysilicon during the anisotropic etch process that defines the transistor gates, so that defects that remain after the pad oxide strip will have less poly remaining in them after the poly etch step. Also, less etching at the bottom reduces the chance of the bottom shorting to an underlying conductor.

In the case of trenches having a nitride liner, the liner is recessed below the surface of the oxide during pad nitride removal. The oxide strip process exposes the nitride liner so that it sticks up above the oxide surface. It can then collect charge during later etching steps or trap poly under overhanging nitride. The inventive method does not recess the oxide below the surface of the nitride because oxide etching is terminated at the base of the fissure caused by the recess of the nitride liner.

Referring now to FIG. 5, there is shown a step, such as at the edge of the TEOS fill in a trench, represented by solid line 74. Lines 66, 68, and 71 represent the inner limit of reaction product and lines 67, 69 and 72 represent the outer surface of the reaction product if the reaction proceeded perpendicular to the initial surface. In such a hypothetical case, the corners would not be rounded but would remain sharp. In actuality, the reaction is not directional and region 75 at the outer corner is rounded until there is a limiting thickness of reaction product on the corner. Region 73 at the inner corner is protected because reaction product from the two surfaces blocks diffusion into the corner. The result is shown as line 76 in FIG. 6, showing the rounded corners.

Referring now to FIG. 7, there is shown in partially schematic, partially pictorial form a portion of an integrated circuit formed with the aid of the invention. Substrate 10 has two transistors of the circuit illustrated explicitly, with the remainder of the circuit shown schematically by a box 85 labelled LOGIC. For convenience, the standard preliminary steps of blanket implants, formation of pad oxide and pad nitride, etc. will be referred to summarily as preparing the substrate. The two transistors 60, having gates 62 and sidewalls 61, are isolated by trenches 15 constructed according to the invention. Drain 63 of the left transistor is connected to source 64 of the right transistor by local interconnect 72, which is isolated from first level metal member 82 by oxide 74. Oxide 74 has a top surface 75 that is treated according to the invention in order to smooth the surface and thereby reduce the danger of shorts. For convenience, the standard back end of line steps of depositing and patterning metal interconnects and inter-level dielectric, formation of contacts, etc. will be referred to as completing the circuit.

The limiting thickness for oxide removal at 23° C. according to the instant process is about 20 nm. This can be increased if desired by heating the wafer above 100° C. to drive off some of the ammonium hexafluorosilicate and then continuing. Preferably, the pad oxide is formed to a thickness smaller than that amount.

While the invention has been described in terms of a single preferred embodiment, those skilled in the art will recognize that the invention is not confined to MOS technology, but may be used with bipolar transistors as well. Similarly, it is not confined to oxide-filled isolation trenches and can be practiced with other layers that contain cracks, the material of which layers is removed in a process that leaves a reaction product having an expanded volume or other embodiments within the spirit and scope of the appended claims. For example, silicon can be removed by the formation of SiO$_2$ and subsequent removal of the SiO$_2$. As an additional example, the method may be used prior to metal deposition in order to improve the yield by reducing or eliminating defects that may fill with metal and cause shorts. Also other methods might be used to create NH$_3$ and HF, such as formation in a plasma discharge from known precursors.

We claim:

1. A method of making an integrated circuit in a silicon substrate having a set of transistors formed in active areas of said substrate and interconnections therebetween, comprising the steps of:

preparing said substrate, including forming a pad oxide thereon;

etching at least one isolation trench about at least one active area;

filling said at least one isolation trench with fill oxide and removing excess fill oxide outside said at least one isolation trench, thereby forming a composite layer of oxide containing said pad oxide and said fill oxide meeting at at least one oxide interface having interface sidewalls;

etching said composite layer of oxide by reacting said composite layer of oxide with HF in a vacuum to form a first reaction product, said first reaction product containing a removal amount of Si, having a first volume, removed from said layer of oxide;

reacting said first reaction product with NH$_3$ in said vacuum to form a second reaction product in situ, said second reaction product having a second volume substantially greater than said first volume, said second reaction product also being substantially resistant to diffusion of HF, whereby said etching step is self-limiting;

continuing said step of reacting said oxide with HF until said pad oxide thickness is removed;

removing said second reaction product;

forming transistors in said active areas; and interconnecting said transistors to form said integrated circuit.

2. A method according to claim 1, in which said fill oxide contains at least one defect having defect sidewalls, a defect bottom, an initial defect depth and an initial defect thickness, in which:

said step of forming said second reaction product in situ comprises forming said second reaction product on said defect sidewalls and said defect bottom until a reaction product thickness of said second reaction product blocks said defect, whereby said HF on said top surface reacts at a greater rate than said HF on said defect bottom so that said defect depth decreases.

3. A method according to claim 2, in which said reaction product thickness blocks said defect initially at said bottom of said defect, whereby said top surface etches at a faster rate than said defect bottom and a final defect shape has a final defect bottom width and a final defect top width greater than said final defect bottom width.

4. A method according to claim 3, in which said defect is a void having a void top within 30 nm of a top surface of said fill oxide.

5. A method according to claim 3, in which said defect is a seam in said fill oxide.

6. A method according to claim 3, in which said defect is a crack in said fill oxide.

7. A method according to claim 3, in which said defect is an interface between said fill oxide and a nitride liner in said isolation trench.

8. A method according to claim 1, in which said composite layer of oxide contains at least one step having an outer corner and in which said steps of reacting said oxide with HF and of reacting said first reaction product with NH$_3$ combine to attack said outer corner preferentially, thereby rounding said outer corner.

9. A method according to claim 1, in which said composite layer of oxide contains at least one step having an inner corner between said pad oxide and said fill oxide and in which said steps of reacting said oxide with HF and of reacting said first reaction product with NH$_3$ combine to inhibit attack on said inner corner.

10. A method of making an integrated circuit in a silicon substrate having a set of transistors formed in active areas of said substrate and interconnections therebetween, comprising the steps of:

preparing said substrate, including forming a pad oxide thereon;

etching at least one isolation trench about at least one active area having isolation sidewalls at an angle greater than 75°;

filling said at least one isolation trench with fill oxide and removing excess fill oxide outside said at least one isolation trench, thereby forming a composite layer of oxide containing said pad oxide and said fill oxide meeting at at least one oxide interface having interface sidewalls;

etching said composite layer of oxide by reacting said composite layer of oxide with HF in a vacuum to form a first reaction product, said first reaction product containing a removal amount of Si, having a first volume, removed from said layer of oxide;

reacting said first reaction product with $NH_3$ in said vacuum to form a second reaction product in situ, said second reaction product having a second volume substantially greater than said first volume, said second reaction product also being substantially resistant to diffusion of HF, whereby said etching step is self-limiting;

continuing said step of reacting said oxide with HF until said pad oxide thickness is removed;

removing said second reaction product;

forming transistors in said active areas; and interconnecting said transistors to form said integrated circuit.

11. A method according to claim 10, in which said composite layer of oxide contains at least one step having an outer corner and in which said steps of reacting said oxide with HF and of reacting said first reaction product with $NH_3$ combine to attack said outer corner preferentially, thereby rounding said outer corner.

12. A method according to claim 10, in which said composite layer of oxide contains at least one step having an inner corner between said pad oxide and said fill oxide and in which said steps of reacting said oxide with HF and of reacting said first reaction product with $NH_3$ combine to inhibit attack on said inner corner.

13. A method according to claim 10, in which said fill oxide contains at least one defect having a defect top within 30 nm of a top surface of said fill oxide, defect sidewalls, a defect bottom, an initial defect depth and an initial defect thickness, and in which:

said step of forming said second reaction product in situ comprises forming said second reaction product on said defect sidewalls and said defect bottom until a reaction product thickness of said second reaction product blocks said defect, whereby said HF on said top surface reacts at a greater rate than said HF on said defect bottom so that said defect depth decreases.

14. A method of making an integrated circuit in a silicon substrate having a set of transistors formed in active areas of said substrate and interconnections therebetween, comprising the steps of:

preparing said substrate, including forming a pad oxide thereon;

etching at least one isolation trench about at least one active area;

filling said at least one isolation trench with fill oxide and removing excess fill oxide outside said at least one isolation trench, thereby forming a composite layer of oxide containing said pad oxide and said fill oxide meeting at least one oxide interface having interface sidewalls;

etching said composite layer of oxide by reacting said composite layer of oxide with HF in a vacuum to form a first reaction product, said first reaction product containing a removal amount of Si, having a first volume, removed from said layer of oxide;

reacting said first reaction product with $NH_3$ in said vacuum to form a second reaction product in situ, said second reaction product having a second volume substantially greater than said first volume, said second reaction product also being substantially resistant to diffusion of HF, whereby said etching step is self-limiting;

continuing said step of reacting said oxide with HF until said pad oxide thickness is removed and removing said second reaction product;

forming transistors in said active areas;

depositing at least one layer of interlevel oxide insulation above said transistors, said interlevel oxide having a having an interlevel oxide top surface and an initial interlevel oxide thickness and containing at least one defect having defect sidewalls, a defect bottom, an initial defect depth and an initial defect thickness;

reacting said interlevel oxide with HF in a vacuum to form a first reaction product, said first reaction product having a first interlevel volume, removed from said layer of interlevel oxide;

reacting said first reaction product with $NH_3$ in said vacuum to form a second reaction product in situ, said second reaction product having a second interlevel volume substantially greater than said first interlevel volume, said second reaction product also being substantially resistant to diffusion of HF, whereby said method of etching is self-limiting;

forming said second reaction product in situ on said defect sidewalls and said defect bottom until a reaction product thickness of said second reaction product blocks said defect, whereby said HF on said interlevel top surface reacts at a greater rate than said HF on said defect bottom so that said defect depth decreases;

continuing said step of reacting said interlevel oxide with HF until a removal amount of said interlevel oxide is removed; and removing said second reaction product, whereby said defect has a final defect depth that is less than said initial defect depth; and interconnecting said transistors to form said integrated circuit.

15. A method according to claim 14, in which said interlevel oxide contains at least one defect having defect sidewalls, a defect bottom, an initial defect depth and an initial defect thickness, in which:

said step of forming said second reaction product in situ comprises forming said second reaction product on said defect sidewalls and said defect bottom until a reaction product thickness of said second reaction product blocks said defect, whereby said HF on said interlevel top surface reacts at a greater rate than said HF on said defect bottom so that said defect depth decreases.

16. A method according to claim 15, in which said reaction product thickness blocks said defect initially at said bottom of said defect, whereby said top surface etches at a faster rate than said defect bottom and a final defect shape has a final defect bottom width and a final defect top width greater than said final defect bottom width.

17. A method according to claim 16, in which said defect is a void having a void top within 30 nm of a top surface of said fill oxide.

18. A method according to claim 16, in which said defect is a crack in said fill oxide.

19. A method according to claim 16, in which said defect is a seam in said fill oxide.

20. A method of etching a layer of oxide on a semiconductor wafer, said oxide having a top surface and an initial oxide thickness and containing at least one defect having defect sidewalls, a defect bottom, an initial defect depth and an initial defect thickness, comprising the steps of:

reacting said oxide with HF in a vacuum to form a first reaction product, said first reaction product containing a removal amount of Si, having a first volume, removed from said layer of oxide;

reacting said first reaction product with $NH_3$ in said vacuum to form a second reaction product in situ, said second reaction product having a second volume substantially greater than said first volume, said second reaction product also being substantially resistant to diffusion of HF, whereby said method of etching is self-limiting;

forming said second reaction product in situ on said defect sidewalls and said defect bottom until a reaction product thickness of said second reaction product blocks said defect, whereby said HF on said top surface reacts at a greater rate than said HF on said defect bottom so that said defect depth decreases;

continuing said step of reacting said oxide with HF until a removal amount of said initial oxide thickness is removed; and removing said second reaction product, whereby said defect has a final defect depth that is less than said initial defect depth.

21. The method according to claim 20, in which said reaction product thickness blocks said defect initially at said bottom of said defect, whereby said top surface etches at a faster rate than said defect bottom and a final defect shape has a final defect bottom width and a final defect top width greater than said final defect bottom width.

22. A method according to claim 21, in which said layer of oxide contains a first area of deposited oxide and a second area of thermal oxide over an active region of said wafer, said deposited oxide and said thermal oxide meeting at least one defect comprising an oxide interface between said thermal oxide and said deposited oxide.

23. A method according to claim 21, in which said layer of oxide contains at least one step having an outer corner and in which said steps of reacting said oxide with HF and of reacting said first reaction product with $NH_3$ combine to attack said outer corner preferentially, thereby rounding said outer corner.

24. A method according to claim 21, in which said layer of oxide contains at least one step having an inner corner between said thermal oxide and said deposited oxide and in which said steps of reacting said oxide with HF and of reacting said first reaction product with $NH_3$ combine to inhibit attack on said inner corner.

25. A method of etching a layer of first material on a semiconductor wafer, said first material having a top surface and an initial first material thickness and containing at least one defect having defect sidewalls, a defect bottom, an initial defect depth and an initial defect thickness, comprising the steps of:

reacting said first material with at least one reactant in a vacuum to form a reaction product, said reaction product containing a removal volume of Si, and having a reaction product volume substantially greater than said removal volume, said reaction product also being substantially resistant to diffusion of HF, whereby said method of etching is self-limiting;

forming said reaction product in situ on said defect sidewalls and said defect bottom until a reaction product thickness of said reaction product blocks said defect, whereby said HF on said top surface reacts at a greater rate than said HF on said defect bottom so that said defect depth decreases;

continuing said step of reacting said first material with HF until a removal amount of said initial first material thickness is removed; and removing said reaction product, whereby said defect has a final defect depth that is less than said initial defect depth.

26. The method according to claim 25, in which said reaction product thickness blocks said defect initially at said bottom of said defect, whereby said top surface etches at a faster rate than said defect bottom and a final defect shape has a final defect bottom width and a final defect top width greater than said final defect bottom width.

* * * * *